United States Patent [19]

Gill, Jr.

[11] Patent Number: 4,641,108

[45] Date of Patent: Feb. 3, 1987

[54] CONFIGURABLE ANALOG INTEGRATED CIRCUIT

[75] Inventor: Harry A. Gill, Jr., Cupertino, Calif.

[73] Assignee: Raytheon Company, Lexington, Mass.

[21] Appl. No.: 788,194

[22] Filed: Oct. 16, 1985

[51] Int. Cl.$^4$ ............................................. H03F 3/04
[52] U.S. Cl. ................................... 330/307; 330/252; 330/257; 357/45
[58] Field of Search .................. 330/252, 255, 307; 307/465, 466, 467; 357/45

[56] References Cited

U.S. PATENT DOCUMENTS 3,621,562  11/1971  Patel ................................ 357/45 X
4,234,888  11/1980  Calhoun et al. ..................... 357/45
4,521,799   6/1985  Davies .............................. 357/51

OTHER PUBLICATIONS

*The Electronic Engineer*, Jun. 1967, p. 68.
Seevinch, "An Uncommitted Integrated Circuit", *The Transactions of the SA Institute of Electrical Engineers*, Aug. 1976, pp. 222–225.

*Primary Examiner*—James B. Mullins
*Attorney, Agent, or Firm*—Richard M. Sharkansky; Peter J. Devlin

[57] ABSTRACT

An integrated circuit comprising a plurality of gain cells interspersed with a plurality of passive and active, electrically isolated components (e.g. thin-film binarily-weighted resistors and transistors). Each gain cell comprises a differential amplifier gain stage comprising a pair of emitter-coupled transistors, the coupled emitters being connected to a current source. The collectors thereof are coupled to a pair of transistors configured as a current mirror. The emitter-coupled transistors, current source and current-mirror transistors are disposed on a first level of the integrated circuit. A first output stage comprising a common-emitter transistor and a second output stage comprising a transistor having an electrically isolated emitter are disposed on the first level. An upper level of metallization is used for selectively coupling either: the output of the differential amplifier gain stage to the first output stage, thereby configuring the gain cell as a comparator; or, additionally, the second output stage transistor between the collector of the first output stage transistor and the output of the differential amplifier, thereby providing an operational amplifier circuit configuration. With such arrangement, each gain cell has a pre-configured gain stage with predetermined electrical characteristics. The manufacturer may then configure each gain cell as either an analog comparator or an operational amplifier having well-defined electrical characteristics during the final metallization process. The gain cells and passive and active components further are selectively interconnected by second level metallization to thereby configure a desired circuit.

16 Claims, 9 Drawing Figures

CONFIGURABLE ANALOG INTEGRATED CIRCUIT

BACKGROUND OF THE INVENTION

This invention relates generally to integrated circuits and more particularly to analog integrated circuits.

As is known in the art, semiconductor integrated circuits generally fall into one of two categories: digital integrated circuits and analog integrated circuits. Digital integrated circuits process signals having one of two discrete signal levels (typically referred to as a logic 1 signal or a logic 0 signal) and include logic gates to process such signals. By contrast, analog integrated circuits either process as input signals thereto and/or produce as output signals therefrom signals having levels which vary in a continuous manner, and include such analog circuits as operational amplifiers, comparators, analog-to-digital converters and voltage regulators, for example. Typically each one of these analog circuits includes a gain stage, that is, a circuit which functions as an amplifier with a gain equal to, greater than, or less than unity, but, in any event, an active circuit.

As is also well-known in the art, one type of digital integrated circuit is commonly referred to as the configurable gate array. Here the integrated circuit manufacturer produces a chip having a large number of identical logic gates arranged in an array. Once such integrated circuit is fabricated, the gates in the array are interconnected by the manufacturer by a final metallization layer selectively in accordance with the overall logic function required by the end user. In this way, the integrated circuit manufacturer is able to produce a large number of identical configurable gate arrays which are suitable for a wide variety of uses, and in response to the particular needs of its customer is able to, in the final metallization process, personalize the integrated circuit to provide logic functions required by its customer. More particularly, the user provides the manufacturer with a logic or truth table relating the logical combinations of logic input signals to produce the desired logic output signals. The relationship between the logic input signals and logic output signals provides the basic functional requirement of the gate array and such is implemented through the final metallization process whereby the individual gates are properly interconnected.

With regard to analog integrated circuits, however, manufacturers typically produce a variety of analog integrated circuit components, each with its own features. The user therefore is required to find the particular component for its needs. Further, the manufacturer generally is required to have an inventory of each of the various components. Recently, there has been a trend to manufacture integrated circuits which include arrays of resistors and three or four types of transistors scattered across the chip. Generally, this approach has been to provide arrays of the various circuit elements in the chip and then interconnect them via the metallization layer selectively in accordance with the circuit desired by the user. Thus, unlike the digital integrated circuit where the gate circuits are each preformed and the personalization is in the interconnection of the gates, here the personalization is in the configuration of the gain stage of the analog circuit itself.

SUMMARY OF THE INVENTION

In accordance with the present invention, an integrated circuit is provided comprising: a plurality of active circuit elements disposed in a semiconductor body and electrically interconnected to provide a pre-configured gain stage and a plurality of different, pre-configured output stages, such gain stage and output stages being disposed in a first level of the integrated circuit; and, means, disposed on a different level of the integrated circuit, for electrically connecting the gain stage to a selected one, or ones, of the plurality of output stages. With such arrangement, the integrated circuit has a pre-configured gain stage with predetermined electrical characteristics. The manufacturer then can configure the circuit as either an operational amplifier or a comparator having well defined electrical characteristics during the final metallization process.

In a preferred embodiment of the invention, an integrated circuit is provided comprising a plurality of gain cells, each gain cell comprising a pre-configured gain stage and a pair of output stages. The pre-configured gain stage includes a differential amplifier comprising a pair of transistors configured as an emitter connected differential pair, the connected emitters being connected to a current source configured transistor and the collectors being connected to a pair of transistors configured as a current mirror. One of the pair of output stages includes a transistor configured as a common emitter. The other one of the output stages includes a transistor configured in the first level with an open circuit emitter. A second level of metallization is used to either: couple the output of the gain stage to the first one of the pair of output stages with the collector of the transistor in such stage providing an output terminal to a thereby configured comparator; or, to also couple the transistor in the second one of the pair of output stages between the collector of the transistor in the first output stage and the differential amplifier of the gain stage to thereby provide the requisite feedback in configuring an operational amplifier.

In accordance with an additional feature of the invention, the integrated circuit includes a plurality of gain cells arranged in an array of rows and columns, such array of gain cells being interspersed with a plurality of passive and active, electrically isolated electrical components having terminals disposed on the first level of the integrated circuit. The gain cells and the passive and active electrical components are selectively interconnected through an upper level metallization to thereby configure a desired circuit comprising gain stages and additional elements (such as resistors and transistors). Included in the passive elements are a plurality of thin film resistors having a plurality of different resistances. A number of the resistors are binarily weighted over a range of resistance values. Also included are a plurality of means for providing intersection of, and electrical isolation between, a first upper level metallization path and a second upper level metallization path by coupling the first path through the first metallization level in the region of such intersection.

BRIEF DESCRIPTION OF THE DRAWINGS

The foregoing features of the present invention and the advantages thereof may be fully understood from the following detailed description read in conjunction with the accompanying drawings wherein.

DESCRIPTION OF THE PREFERRED EMBODIMENT

Figure 1:
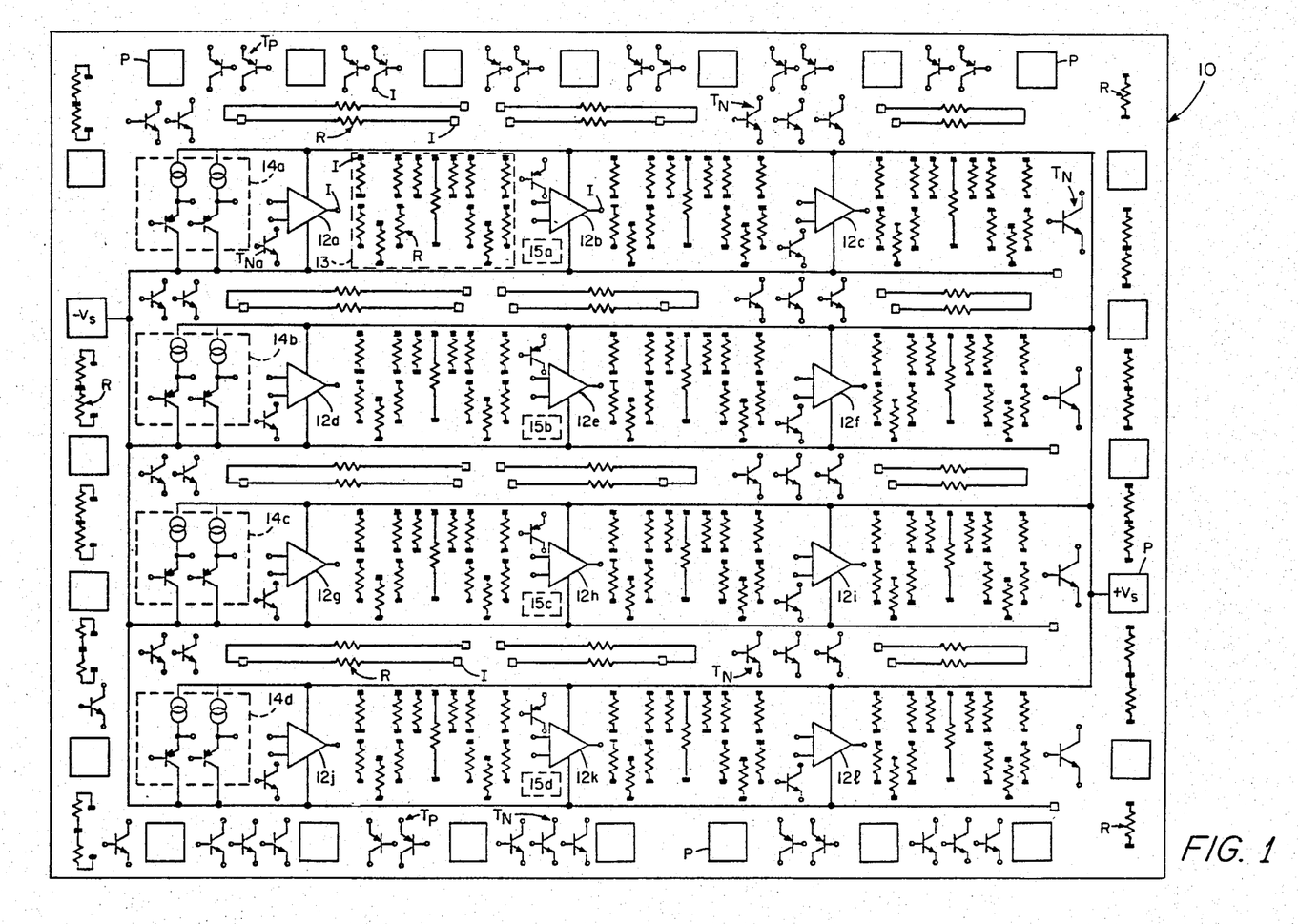
FIG. 1 is a partial schematic diagram of the configurable analog integrated circuit assembly of the present invention including a plurality of the configurable analog integrated circuits of the present invention.

Referring now to FIG. 1, the integrated circuit 10 of the present invention is schematically shown. Integrated circuit 10 comprises a plurality, here twelve, of electrically isolated gain cells 12a–12l arranged in an array of rows and columns, here four rows and three columns. The plurality of gain cells 12a–12l are interspersed among a plurality of electrically isolated, active and passive electrical components, here forty-three NPN bipolar transistors $T_N$, twenty PNP bipolar transistors $T_P$ and one hundred seventy six passive, thin-film resistors R, each having interconnect terminals I disposed on a first level of metallization of integrated circuit 10. Here, the thin film resistors R range in value from 1.25 to 150 kilo-ohms. A number of the thin-film resistors R are grouped into a plurality, here twelve, of resistor cells 13, each resistor cell 13 here comprising thirteen, binarily-weighted resistors, as will be explained. The electrical components are selectively interconnected to a selected one, or ones, of the plurality of gain cells 12a–12l through an upper layer of metallization (not shown) to thereby configure a desired circuit in a manner to be described. That is, upper level metallization connections are formed in a manner to be described between the interconnect terminals I of the electrical components selected for interconnection. Here, each one of gain cells 12a–12l is substantially identical in construction, comprising a differential amplifier gain stage and a plurality of different, electrically isolated output stages. Each gain cell is configurable as either an operational amplifier or an analog comparator, as will be described. Integrated circuit 10 also comprises a plurality, here four, of identically-configured input cells 14a–14d, suitable for connection to the inputs of selected gain cells 12a–12l to provide preliminary current gain to input signals to be applied to said selected gain cells 12a–12l. Integrated circuit 10 further includes a plurality of circuits 15a–15d for controlling the internal operating currents of each one of the plurality of gain cells 12a–12l and the input cells 14a–14d. Each one of the current control circuits 15a–15d is disposed in one of the four rows of gain cells 12a–12l and input cells 14a–14d. For example, control circuit 15a is disposed on integrated circuit 10 horizontally with input cell 14a and gain cells 12a, 12b, 12c. Each control circuit 15a–15d provides independent control of the internal current flow in each one of the gain cells 12a–12l and input cells 14a–14d disposed in a common horizontal row therewith in a manner to be described. For example, circuit 15a independently controls the internal current flowing in gain cells 12a, 12b and 12c and in input cell 14a. A plurality, here twenty-four, of pads P are disposed around the periphery of integrated circuit 10 providing external wire connection points to integrated circuit 10. Two of such pads P are dedicated to positive and negative power supply connections $+V_s$, $-V_s$, as shown. Integrated circuit 10 may, however, be used with a single power supply, such as $+V_s$, in which case the $-V_s$ pad is connected to ground potential (OV).

Figure 2:
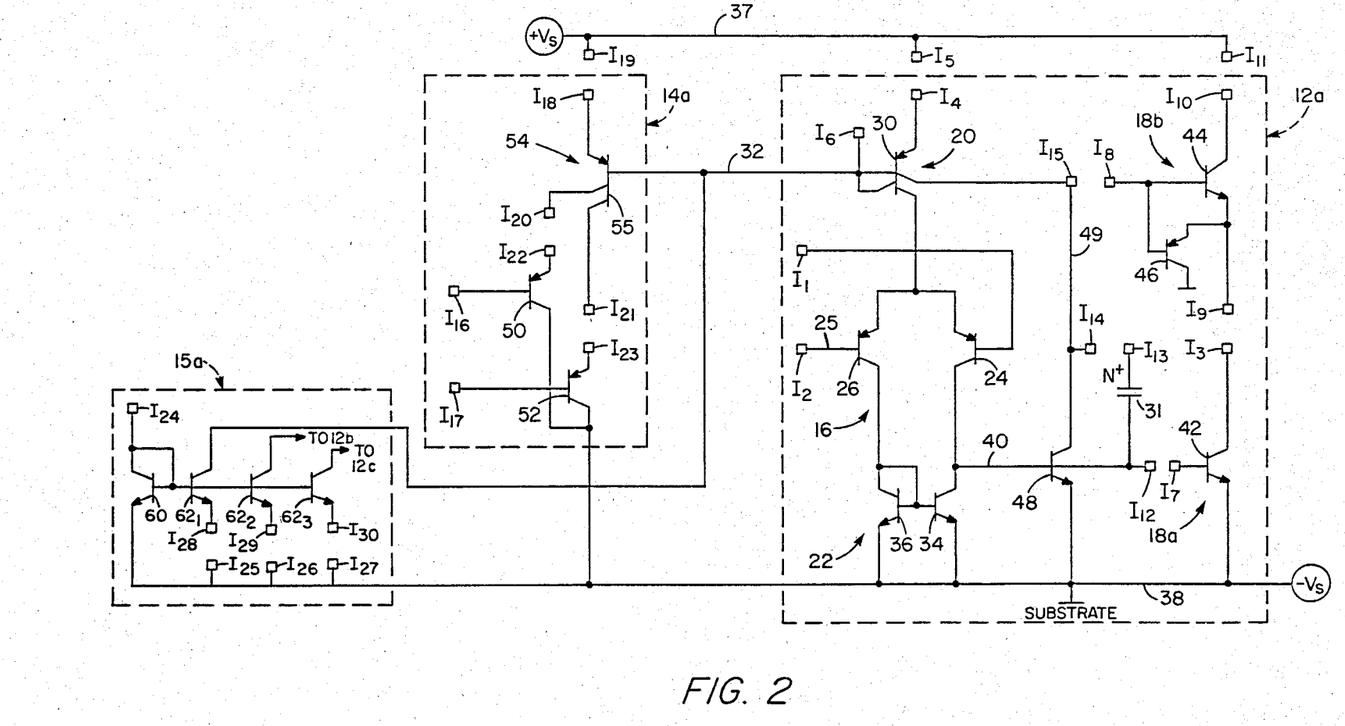
FIG. 2 is a schematic diagram of an individual one of the plurality of configurable analog integrated circuits of FIG. 1.

Referring now to FIG. 2, a representitive one of the plurality of gain cells 12a–12l, here gain cell 12a, is schematically shown in detail, along with input cell 14a, which is typical of input cells 14a–14d, and control circuit 15a; which is representative of control circuits 15a–15d. Gain cell 12a comprises gain stage 16 and a plurality, here two, of output stages 18a, 18b. Also included are dual current source 20 and current mirror 22, formed, along with gain stage 16 and output stages 18a, 18b, on a first level of integrated circuit 10. The above-identified elements of gain cell 12a are interconnected in a predetermined manner by a first level of metallization, represented by solid lines in FIG. 2, to thereby form: a pre-configured gain section, comprising gain stage 16, dual current source 20, current mirror 22 and transistor 48; and, pre-configured output stages 18a, 18b. Through the use of second level metallization connections between interconnect terminals I (represented by hatched connections in FIGS. 3 and 4) made in a manner to be described, gain cell 12a may be configured in a selected one of several ways, such as an operational amplifier or an analog comparator, as will be described in detail hereinafter.

Gain stage 16 here comprises a differential amplifier comprising a pair of identical, emitter-coupled, bipolar, PNP transistors 24, 26. The base electrode of transistor 24 is coupled by first level metallization to interconnect terminal $I_1$, interconnect terminal $I_2$ being coupled to the base electrode of transistor 26 by first level metallization path 25. The emitter electrodes of transistors 24, 26 are coupled together and to dual current source 20 by first level metallization. Dual current source 20 comprises PNP transistor 30 having a pair of collector electrodes, a first one of which is coupled to the emitters of transistors 24, 26. The emitter electrode of transistor 30 is coupled to terminal $I_4$ for interconnection by second level metallization to terminal $I_5$, fed by positive supply voltage $+V_s$ along first level path 37. The base electrode of transistor 30 is connected by first level metallization to interconnect terminal $I_6$ and to first level metallization path 32 for purposes to be discussed.

The collector electrodes of differential amplifier transistors 24, 26 are connected by first level metallization to the collector electrodes of identical NPN transistors 34, 36 which comprise current mirror 22. The base electrodes of current mirror transistors 34, 36 are coupled together and to the collector electrode of transistor 36 by first level metallization. The emitter electrodes of transistors 34, 36 are coupled to first level metallization path 38, which is fed by negative supply voltage $-V_s$, as shown. Thus, it is seen that current mirror transistor 36 is connected as a diode between the base electrode of current mirror transistor 34 and $-V_s$. The output of differential amplifier gain stage 16 is disposed at the junction of the collector electrodes of transistors 24, 34 and appears on first level metallization path 40.

Also included in gain cell 12a as part of the gain section comprising differential amplifier gain stage 16, dual current source 20 and current mirror 22 is NPN amplifier transistor 48. The base electrode thereof is coupled to first level metallization path 40, which in turn is connected to interconnect terminal $I_{12}$ and a first, metallized end of integrated capacitor 31, as shown. The second, doped (N+) end of capacitor 31 is coupled by first level metallization to interconnect terminal $I_{13}$. The collector electrode of amplifier transistor 48 is connected by first level metallization path 49 to the second collector electrode of dual current source transistor 30. Disposed on path 49 are interconnect terminals $I_{14}$, $I_{15}$, as shown. The emitter electrode of transistor 48 is coupled to first level metallizaton path 38, which is coupled to the substrate of integrated circuit 10 and fed by negative supply voltage $-V_s$. Thus, it is appreciated that amplifier transistor 48 is configured as a common-emitter device and is thus an inverting amplifier stage.

First output stage 18a comprises NPN transistor 42, connected as a common-emitter device with the emitter electrode thereof coupled to $-V_s$ by first level metallization, as shown. The base electrode of first output stage transistor 42 is connected by first level metallization to interconnect terminal $I_7$ for connection by second level metallization to the output of differential amplifier gain stage 16 in a manner to be described. The collector electrode of transistor 42 is coupled to interconnect terminal $I_3$, the output terminal of gain cell 12a, by first level metallization.

Second output stage 18b comprises a pair of transistors, NPN output transistor 44 and PNP transistor 46. The base electrodes thereof are connected together and to interconnect terminal $I_8$ by first level metallization. The emitter electrodes of such transistors similarly are interconnected with terminal $I_9$. Interconnect terminal $I_{10}$ is connected by first level metallization to the collector of transistor 44, providing for application of $+V_s$ to such electrode upon connection by second level metallization between terminals $I_{10}$ and $I_{11}$. Interconnect terminal $I_{17}$, along with terminal $I_5$, is disposed on first level metallization path 37 is fed by positive supply voltage $+V_s$, as shown. The collector electrode of transistor 46 is coupled to the substrate of integrated circuit 10, which is fed by negative supply voltage $-V_s$, as shown.

Representative input cell 14a comprises a pair of PNP transistors 50, 52 and a dual current source 54 comprising dual collector, PNP transistor 55. Transistors 50, 52, 55 are all fabricated on the first layer of integrated circuit 10 and selectively interconnected by first level metallization (shown by solid lines in FIG. 2). The collector electrodes of transistors 50, 52 are connected together by first level metallization and are further coupled to first level path 38, thereby coupling negative supply voltage $-V_s$ to such collector electrodes. The base electrode of transistor 50 is coupled to interconnect terminal $I_{16}$, and terminal $I_{17}$ to base electrode of transistor 52, by first level metallization. The emitter electrode of transistor 55 is coupled to terminal $I_{18}$, which is adapted for connection by second level metallization to terminal $I_{19}$, disposed on first level path 37, to thereby couple positive supply voltage $+V_s$ to such emitter electrode. The two collector electrodes of transistor 55 are connected by first level metallization to interconnect terminals $I_{20}$, $I_{21}$, respectively. Terminals $I_{20}$, $I_{21}$ are adapted to be coupled by second level metallization to terminals $I_{22}$, $I_{23}$, respectively, which are connected to the emitter electrodes of transistors 50, 52, respectively, thereby feeding supply current to transistors 50, 52 from dual current source transistor 55.

Current control circuit 15a is configured as a plurality of current mirrors, the output of each one of the plurality of current mirrors being coupled to a corresponding one of gain cells 12a, 12b, 12c. Specifically, the plurality of current mirrors comprise a common NPN input transistor 60, with each current mirror having an independent output NPN transistor $62_1$, $62_2$, $62_3$, transistors 60, $62_1$, $62_2$, $62_3$ being identical in configuration. The base electrodes of transistors 60, $62_1$, $62_2$, $62_3$ are coupled together and to interconnect terminal $I_{24}$ on a first level of metallization, with the collector electrode of input transistor 60 also being connected to terminal $I_{24}$. The emitter electrode of input transistor 60 is coupled to first level metallization path 38, and hence to negative supply voltage $-V_s$, as are interconnect terminals $I_{25}$, $I_{26}$, $I_{27}$, for purposes to be described. Thus, it is seen that transistor 60 is connected as a diode between terminal $I_{24}$ and $-V_s$. The emitter electrodes of transistors $62_1$, $62_2$, $62_3$ are coupled to corresponding interconnect terminals $I_{28}$, $I_{29}$, $I_{30}$ by first level metallization, as shown. The collector electrode of transistor $62_1$ forms the output of the first one of the plurality of current mirrors comprising current control circuit 15a. Such collector electrode is coupled by first level metallization to first level metallization path 32, and hence to the base electrode of dual current source transistor 30 and the collector electrode of transistor 48 in gain cell 12a to provide control of the internal operating current of gain cell 12a in a manner to be described. The collector electrodes of output transistors $62_2$, $62_3$, forming the outputs of the second and third current mirrors of current control circuit 15a, are similarly coupled by first level metallization to like elements in gain cells 12b, 12c, respectively, to provide control of the internal operating currents of gain cells 12b, 12c, respectively. Referring for a moment to FIG. 1, it is seen that input cell 14a is disposed an integrated circuit 10 adjacent to gain cell 12a. Hence, as shown in FIG. 2, the collector electrode of transistor $62_1$ is also coupled by first level metallization path 32 to the base electrode of dual current source transistor 55 in input cell 14a to control the internal operating current of input cell 14a in a manner to be described.

Figure 3:
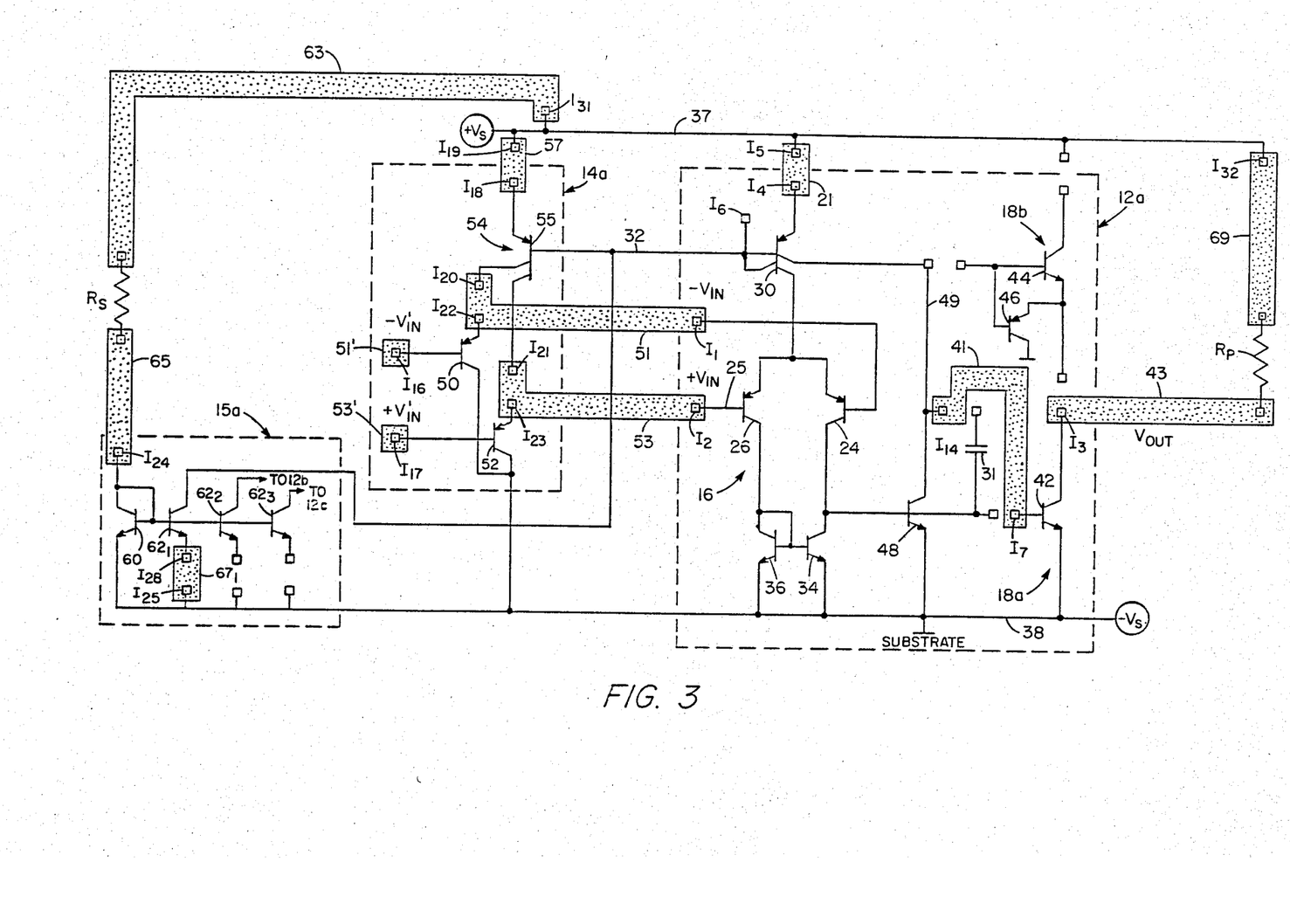
FIG. 3 is a schematic diagram of the circuit of FIG. 2 connected as a analog comparator.

As discussed earlier, in the present invention the plurality of gain cells 12a–12l may individually be configured as either an operational amplifier or an analog comparator through the use of second level metallization to make interconnections between selected interconnect terminals I. Thus, gain cell 12a may be configured as either an operational amplifier or analog comparator by selective interconnection of differential amplifier gain stage 16 with a selected one, or ones, of output stages 18a, 18b by second level metallization. Referring to FIG. 3, gain cell 12a is shown with second level metallization connection 41 made between differential amplifier gain stage 16 and first output stage 18a to configure such gain cell as an analog comparator. It is again noted that first level metallization connections are shown by solid lines. Connections by second level metallization are shown by wide, shaded lines in FIG. 3. The output of differential amplifier gain stage 16, amplified and shifted 180° in phase (i.e. inverted) by common-emitter transistor 48 and appearing on first level metallization path 49, is coupled to first output stage 18a via second level metallization path 41, formed between interconnect terminals $I_{14}$ and $I_7$. The output of the comparator-configured gain cell 12a appears at interconnect terminal $I_3$, to which second level metallization connection 43 is made. It is noted that common-emitter transistor 42 of first output stage 18a is connected as an open-collector-output device when gain cell 12a is connected in the analog comparator configuration. Thus, it is seen that in the comparator configuration, second output stage 18b is not utilized, and hence is left entirely disconnected from the remainder of gain cell 12a. Gain cell 12a is applied with voltage from positive supply $+V_s$ by coupling the emitter electrode of dual current source transistor 30 to $+V_s$ by forming second level metallization connection 21 between interconnect terminals $I_4$, $I_5$. Dual current source transistor thus is able to conventionally provide DC operating (i.e. bias) current to the remainder of gain cell 12a. It is noted that here the pair of collector electrodes of dual current source transistor 30 are configured differently, as is known in the art, to allow transistor 30 to supply different levels of bias current to amplifier transistor 48 and differential amplifier 16, respectively. Here, the ratio of bias current provided to transistor 48 and differential amplifier 16 is approximately two to one.

The input signals to comparator-configured gain cell 12a may be applied directly as $-V_{IN}$ and $+V_{IN}$ to interconnect terminals $I_1$, $I_2$, respectively, in which case such input signals would be fed directly to the base electrodes of transistors 24, 26 comprising differential amplifier gain stage 16. However, in some applications, it may be necessary to buffer such input signals before applying the input signals to differential amplifier 16. In such applications, input cell 14a is electrically coupled to input terminals $I_1$, $I_2$ of gain cell 12a by second level metallization. Specifically, second level metallization path 51 is formed between interconnect terminals $I_{20}$, $I_{22}$ and $I_1$. Similarly, second level metallization path 53 is formed between interconnect terminals $I_{21}$, $I_{23}$ and $I_2$. With such arrangement, the input signals for gain cell 12a are applied as to input cell 14a by second level metallization connections 51', 53', respectively, at terminals $I_{16}$, $I_{17}$ (rather than directly to gain cell 12a at terminals $I_1$, $I_2$) and here are denoted as $-V_{IN}'$ and $+V_{IN}'$, respectively. Thus it is seen that transistors 50, 52 are used as emitter-follower devices to provide current gain and unity voltage gain to input signals applied thereto. Transistors 50, 52 thus comprise a preliminary gain stage for input signals applied to gain cell 12a. Power is applied to input cell 14a by coupling second level metallization path 57 between interconnect terminals $I_{18}$, $I_{19}$, thereby permitting dual current source transistor 55 to supply DC operating current to transistors 50, 52 in a conventional manner. Here, equal bias currents are supplied to transistors 50, 52. Referring again to FIG. 1, it is noted that while, for example, input cell 14a is disposed adjacent to gain cell 12a, input cell 14a may instead be utilized as a buffer stage for gain cells 12b or 12c by making the above-described second level metallization connections 51, 53 between input cell 14a and terminals $I_1$ and $I_2$ of the selected gain cell 12b or 12c.

As discussed, current-mirror transistors 60, $62_1$ of current control circuit 15a control the internal operating currents (i.e. the DC or quiescent currents) of gain cell 12a and input cell 14a. Such transistors are connected in a basic current mirror configuration by first level metallization, as shown. The output of such current mirror is taken at the collector electrode of transistor $62_1$ and is coupled by first level metallization path 32 to the base electrodes of dual current source transistors 30, 55, respectively. The collector of transistor 60 forms the input terminal of the plurality of current mirrors of control circuit 15a. The reference current for the current mirror is equal to the collector current of transistor 60. Collector current for transistor 60 is provided by connecting an external resistor $R_s$ between interconnect terminal $I_{24}$ (at the collector of transistor 60) and terminal $I_{31}$ (disposed at a $+V_s$ potential on first level path 37). One of the thin film resistors R disposed on integrated circuit 10 may be used as $R_s$. Second level metallization path 63 is formed to connect a first end of $R_s$ to terminal $I_{31}$. A second end of $R_s$ is coupled to $I_{24}$ by second level metallization path 65. Since interconnect terminal $I_{31}$ is at a potential of $+V_s$, a little thought reveals that current flows through $R_s$ into the collector and base electrodes of diode-connected transistor 60, the magnitude of such current being determined by the value of $R_s$. The emitter of transistor $62_1$ comprises the control terminal of the current mirror of transistors 60, $62_1$. When unconnected, no collector current is produced by transistor $62_1$ and no bias current will be coupled to gain cell 12a or input cell 14a. However, when the emitter is coupled to a reference potential (such as $-V_s$), collector current is produced by transistor $62_1$, supplying bias current to gain cell 12a and input cell 14a. Here, such emitter is coupled by second level metallization path $67_1$ to path 38, and hence to reference potential $-V_s$. Since transistors 60, $62_1$ are connected as a current mirror and are matched devices, the collector current produced by transistor $62_1$ will be related to the collector current of transistor 60 in a well-defined manner. Specifically, the ratio between the collector currents of transistors 60, $62_1$ is determined by the dc beta of such matched transistors. Here, such ratio is one-to-one. Additional flexibility in setting the operating current level of gain cell 12a and input cell 14a may be obtained by replacing second level metallization path $67_1$ with a resistor $R_x$ (not shown), such as one of the thin film resistors R disposed on integrated circuit 10, connected between terminals $I_{25}$, $I_{28}$ by second level metallization connections in the same manner as that described above for resistor $R_s$. As is known, the size of $R_x$ will further affect the ratio between the collector current of transistor 60 and that of transistor $62_1$. A little thought reveals that gain cells 12a, 12b, 12c may be set to have different operating currents by placing different-valued resistors between $-V_s$ and the emitter control electrodes of transistors $62_1$, $62_2$, $62_3$, respectively.

It is thus seen that the collector current of transistor $62_1$ is set to a predetermined level by the value of $R_s$ (and that of $R_x$ if such resistor is used). As is known, such current controls the amount of base current permitted to flow into dual current source transistors 30, 55, thereby controlling the level of conductance of such transistors. Since transistors 30, 55 supply DC operating current to the devices in gain cell 12a and input cell 14a, respectively, it is seen that transistors 60, $62_1$ of current control circuit 15a determine the operating currents of gain cell 12a and input cell 14a. The current mirror formed by transistors 60, 62₂ similarly controls the operating current of gain cell 12b, while the quiescent current of gain cell 12c is determined by the current mirror comprising transistors 60, 62₃. Interconnect terminal I₆ provides direct access to the base electrodes of transistors 30, 55, allowing an external control signal (from a source not shown) to be applied thereto to turn off transistors 30, 55 and disable gain cell 12a and input cell 14a. While it was stated above that input cell 14a could be used with gain cells 12b or 12c in place of gain cell 12a, a little thought reveals that the bias current of input cell 14a depends on that set for gain cell 12a. Thus, the bias current level set for gain cells 12b or 12c must be identical to that set for gain cell 12a in order to be able to use input cell 14a with gain cell 12b or gain cell 12c.

In operation, gain cell 12a functions as a conventional analog comparator, such as a model LM 339 comparator, manufactured by Raytheon Company of Mountain View, Calif. 94039, when configured in the manner described above and shown in FIG. 3. That is, gain cell 12a produces an output signal $V_{out}$ at terminal I₃ having a first state when the input signal level fed to input terminal I₂ ($+V_{IN}$) exceeds that applied to input terminal I₁ ($-V_{IN}$), and having a second output state when the reverse is true. As is known, such operation is assisted by coupling the output terminal I₃ (and hence the collector of open-collector first output stage transistor 42) of comparator-configured gain cell 12a to a supply voltage, such as $+V_s$, through an external resistor, $R_P$. Here, one of the thin film resistors R on integrated circuit 10 may be used as $R_P$. A first end of resistor $R_P$ is coupled by second level metallization path 69 to interconnect terminal I₃₂ on first level path 37 (and hence applied with $+V_s$), and a second end of such resistor $R_P$ is coupled to terminal I₃ by second level metallization path 43. Thus, it is seen that output transistor 42 is placed in the cutoff mode when the input signal applied as $+V_{IN}$ (at I₂) exceeds the input signal coupled to I₁ as $-V_{IN}$, allowing a voltage of approximately $+V_s$ to appear as $V_{out}$ at output terminal I₃. Conversely, when the input signal at $-V_{IN}$ exceeds that at $+V_{IN}$, transistor 42 is driven into saturation by inverting amplifier transistor 48, applying approximately $-V_s$ as $V_{out}$ to output terminal I₃. As is known, the open-collector output of transistor 42 may be connected differently than in the manner described above and shown in FIG. 3, depending on the application of comparator-configured gain cell 12a. For example, such output may be applied as positive feedback to $+V_{IN}$ to increase the switching speed of the comparator. In the present invention, this is achieved by coupling output terminal I₃ to terminal I₂ (or to terminal I₁₇ if input cell 14a is used) by a second level metallization path (not shown), either directly or through one of the thin-film resistors R on integrated circuit 10.

Figure 4:
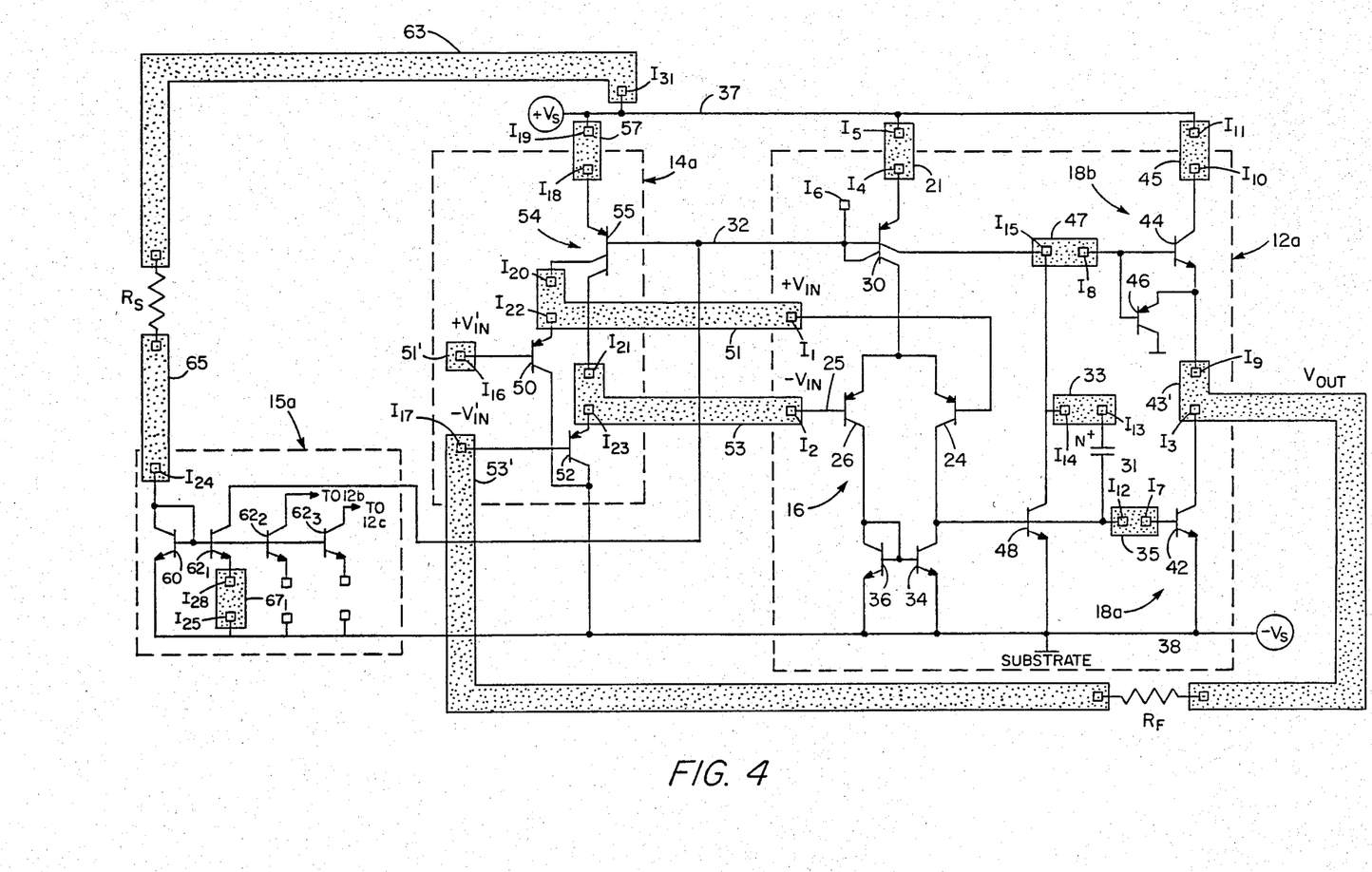
FIG. 4 is a schematic diagram of the circuit of FIG. 2 connected as an operational amplifier.

Referring now to FIG. 4, gain cell 12a is shown with second level metallization connections made between gain stage 16 and output stages 18a, 18b to configure gain cell 12a as an operational amplifier (op amp). Input cell 14a and current control cell 15a are connected and function as described above. Hence, such will not be repeated here. It should be noted, however, that the use of input cell 14a is not required for gain cell 12a to operate. However, input cell 14a provides buffering (via emitter-follower transistors 50, 52) to permit use of low input signal currents without sacrificing operating speed. It is also noted that the input signal interconnect terminals I₁, I₂ have different polarity designations when gain cell 12a is configured as an op amp than when such gain cell is in the comparator configuration. That is, in the op amp configuration, terminal I₁ is assigned the $+V_{IN}$ designation, while terminal I₂ is denoted as $-V_{IN}$. The reason for such terminology difference between the comparator and op amp configurations is the presence of the single, inverting transistor (common-emitter transistor 48) disposed between gain stage 16 and output stages 18a, 18b. Consequently, the designations of $+V_{IN}'$ and $-V_{IN}'$ at input cell 14a are also reversed, with $+V_{IN}'$ assigned to terminal I₁₆ and $-V_{IN}'$ to terminal I₁₇.

As stated, in the operational amplifier configuration, gain cell 12a utilizes both first and second output stages 18a, 18b. The base electrode of second output stage transistor 44 is coupled to first level path 49 via second level metallization connection 47 made between terminals I₈, I₁₅. Second level metallization connection 43' is made between terminal I₉ and gain cell output terminal I₃, thereby coupling the emitter electrode of transistor 44 to output terminal I₃, thus configuring transistor 44 as an emitter-follower. Thus connected, second output stage transistor 44 is connected between the output of first output stage transistor 42 and differential amplifier gain stage 16. Second output stage transistor 44 is supplied with power by coupling second level metallization path 45 between terminals I₁₀, I₁₁, thereby coupling $+V_s$ to the collector electrode of transistor 44. Frequency compensating capacitor 31, which is an integrated capacitor fabricated on the first level of integrated circuit 10, is coupled across the base-collector junction of amplifier transistor 48 by second level metallization connection 33 made between terminals I₁₃, I₁₄, coupling the collector of amplifier transistor 48 to the second, doped (N+) end of capacitor 31. The first, metallized end of capacitor 31, preconnected at the first level to path 40 and the base electrode of transistor 48, is connected to the base electrode of first output stage transistor 42 by second level metallization path 35. Thus, it is seen that transistors 42, 44 are connected in parallel at the output of gain cell 12a, with the base electrode of transistor 42 being fed by the output signal of gain stage 16, and the base electrode of transistor 44 being applied with the amplified and inverted (by transistor 48) output signal of gain stage 16. The emitter electrode of transistor 30 is coupled to $+V_s$ via second level metallization path 21 connected between terminals I₄, I₅. Dual current source transistor 30 thus provides bias current for differential amplifier 16 and amplifier transistor 48, as described above.

Thus it is seen that each one of the plurality of gain cells 12a–12l may be configured as an operational amplifier simply by making the proper second level metallization connections between the pre-configured gain stage 16 and each one of the pair of pre-configured output stages 18a, 18b. Configured as described above, gain cell 12a functions as a conventional operational amplifier, such as a model LM 324 operational amplifier, manufactured by Raytheon Company of Mountain View, Calif. 94039, with output transistors 42, 44 receiving and amplifying 180° out-of-phase input signals (from the base and collector electrodes, respectively, of inverting amplifier transistor 48) in a class B, push-pull arrangement to produce an output signal $V_{out}$ at terminal I₃. Transistor 46 supplies increased current drive for negative-going output signals and also protects transistor 44 by conducting and diverting current therefrom if $V_{out}$ becomes too great. Thus, transistor 46 provides over-voltage-protection for transistor 44. A feedback loop, for example negative feedback, may be used to control the gain of operational amplifier-configured gain cell 12a, as is known. In the present invention, negative feedback may be provided by coupling output terminal $I_3$ to $-V_{IN}$ terminal $I_2$ (or to $-V_{IN}'$ terminal $I_{17}$ if input cell 14a is used as shown in FIG. 4) by second level metallization, either directly or through an external resistor $R_F$. One of the thin-film resistors R on integrated circuit 10 may be used as $R_F$. A first end of such resistor is coupled to output terminal $I_3$ by second level metallization path 43'. Second level metallization path 53' couples the second end of $R_F$ to $-V_{IN}'$ input terminal $I_{17}$ of input cell 14a, as shown (or to $-V_{IN}$ input terminal $I_2$ of gain cell 12a if input cell 14a is not used).

Figure 5:
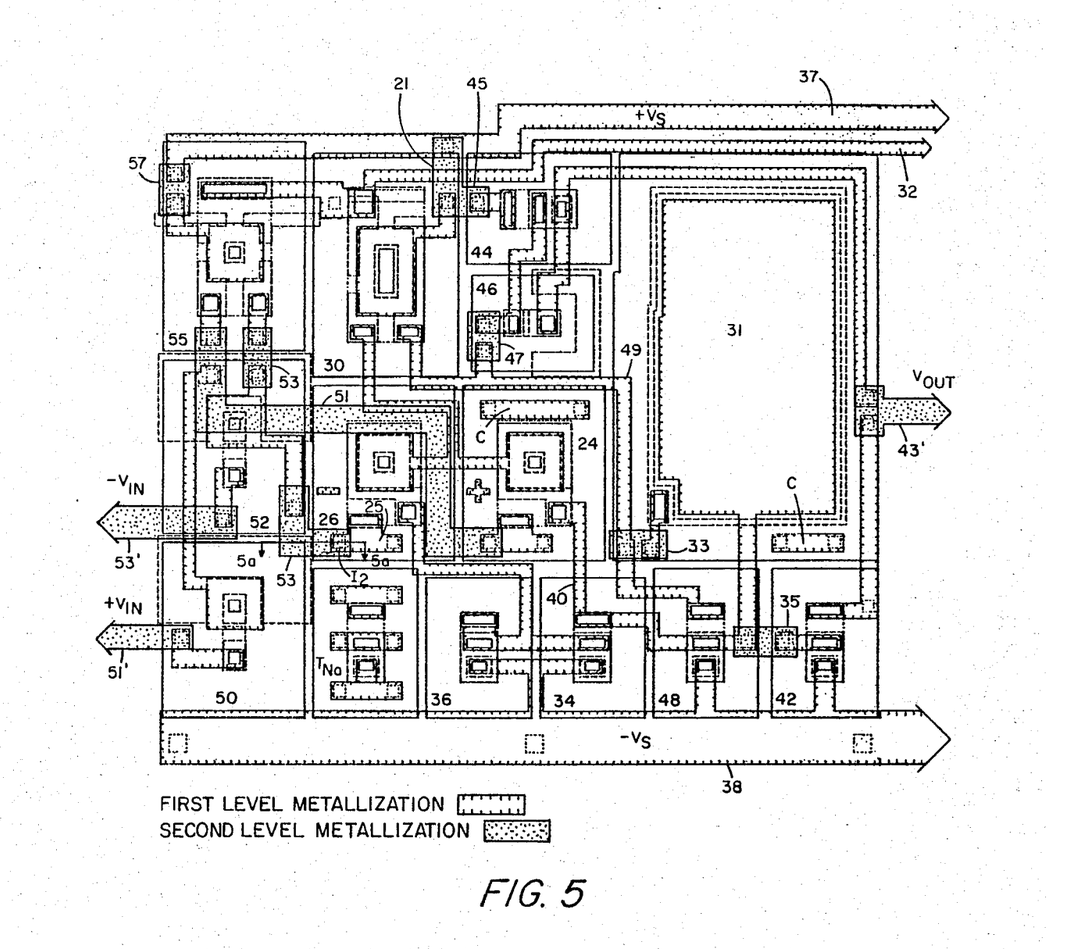
FIG. 5 is a plan view of the layout of circuit elements of the analog integrated circuit of FIG. 4.

Referring to FIG. 5, the physical layout on integrated circuit 10 of the operational-amplifier-configured gain cell 12a and input cell 14a of FIG. 4 is shown without control circuit 15a or feedback resistor $R_F$ connections. First level metallization connections, such as first level paths 40, 49, are depicted by wide, speckled lines, while wide, darker shaded lines illustrate second level metallization connections, such as paths 51', 53'. Also shown is the layout of electrically isolated NPN transistor $T_{Na}$ (shown disposed between gain cell 12a and input cell 14a in FIG. 1). The physical layout of gain cell 12a also comprises a plurality, here two, of crossunders C, the purpose and operation of which are described in detail hereinafter.

Figure 5A:
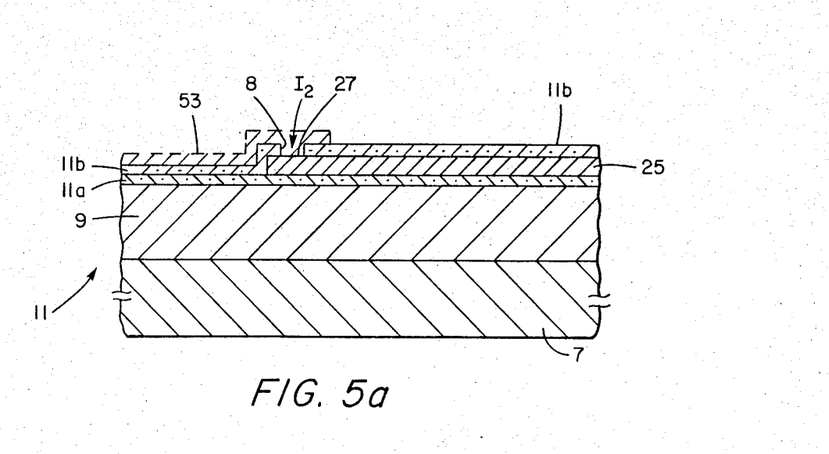
FIG. 5a is a cross-sectional view of one of the circuit elements of FIG. 5.

Referring to FIG. 5a, a cross-section of a second level metallization connection made to a representative first level metallization path, here path 25, is shown in the region of interconnect terminal $I_2$ thereof to illustrate the connection of an upper level metallization path, such as second level path 53 to such terminal $I_2$. All first level metallization, such as path 25, is formed on an insulating oxide layer 11a disposed on an upper surface of semiconductor body 11 of integrated circuit 10. Semiconductor body 11 comprises substrate 7 having epitaxial layer 9 disposed thereon, as shown. The first level metallization thus is electrically isolated from substrate 7. The first level metallization, such as path 25, is overlaid with a nonconducting oxide layer 11b to provide insulation for such first level metallization. Interconnect terminal $I_2$ comprises an end portion 27 of path 25 exposed by a via hole 8 passing through oxide layer 11b. An upper level metallization connection is made to terminal $I_2$ by forming second level metallization, such as path 53, over via hole 8, the metallization forming in (i.e. filling) via hole 8 and contacting first level path 25. Thus, an electrical connection is made between first level metallization path 25 and second level metallization path 53.

Figure 6:
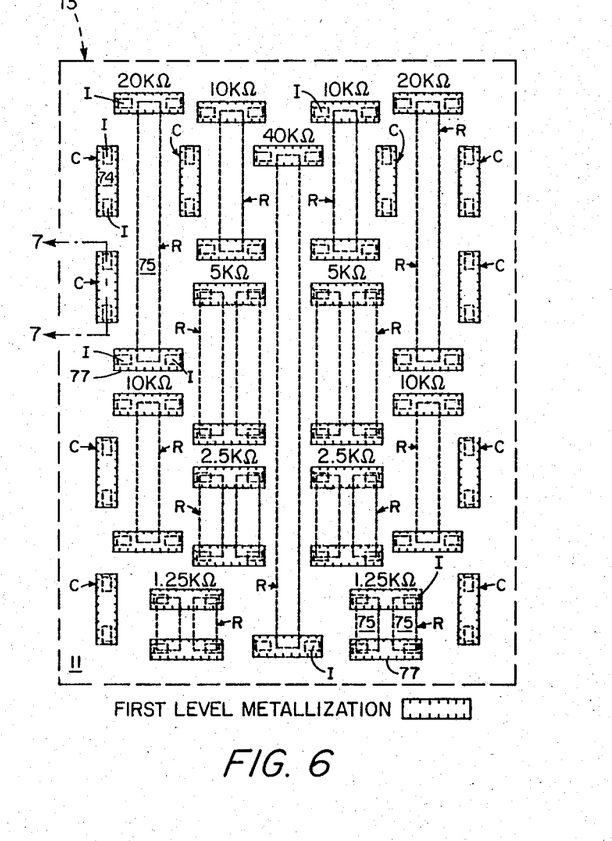
FIG. 6 is a plan view of the layout of additional circuit elements on the analog integrated circuit assembly of FIG. 1.

Referring now to FIG. 6, the physical integrated circuit layout of one of the plurality of resistor cells 13 is shown. Resistor cell 13 comprises a plurality, here thirteen, of electrically isolated, thin-film resistors R. It is noted that prior analog circuit arrays utilized resistors formed by diffusion. The use of thin films to fabricate resistors R in the configurable analog integrated circuit 10 of the present invention permits formation of resistors having more accurate resistance values than were previously obtainable using diffusion resistors. Also, the resistance of thin film resistors varies less with temperature than does the resistance of diffusion-formed resistors. Here, the thirteen resistors R in each resistor cell 13 have binarily weighted resistances (here 1.25, 2.5, 5.0, 10, 20 and 40 kilo-ohms), facilitating the design of, for example, analog-to-digital converter circuits using a resistor cell 13 and a gain cell (such as cell 12a). Here, there are two 1.25, 2.5, 5.0 and 20 kilo-ohm resistor, four 10 kilo-ohm resistors and one 40 kilo-ohm resistor in each resistor cell 13. Each resistor R comprises a strip 75 of thin-film resistance material coupled between a pair of first level metallization strips 77, each first level metallization strip 77 including a pair of interconnect terminals I. The 1.25, 2.5 and 5.0 kilo-ohm resistors comprise a pair of parallel resistance strips 75 running between first level metallization strips 77, as shown. Connections therebetween are made by second level metallization in the manner described above.

Figure 7:
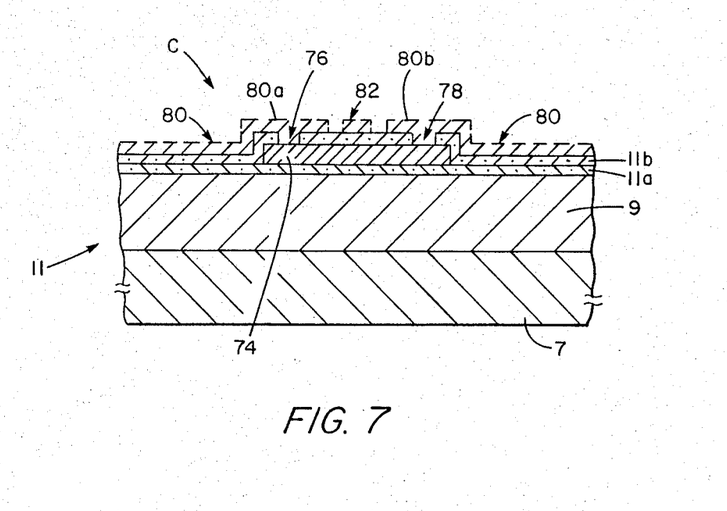
FIG. 7 is a cross-sectional view of one of the circuit elements of FIG. 6.

Each resistor cell 13 also includes a plurality, here ten, of crossunders C. As stated above with reference to FIG. 5, each gain cell 12a–12l also comprises a pair of crossunders C. A cross-section of one of the crossunders C disposed in resistor cell 13 is shown in FIG. 7. Crossunder C comprises a short, electrically isolated strip of first level metallization 74. Strip 74 is disposed on a first insulating oxide layer 11a formed on the upper surface of the epitaxial layer 9 of semiconductor body 11. Thus, first level strip 74 is electrically isolated from substrate 7. A second electrically nonconductive oxide layer 11b is disposed over strip 74 and first oxide layer 11a. Disposed through second oxide layer 11b at opposite ends of first level metallization strip 74 are a pair of via holes 76, 78. Via holes 76, 78 extend completely through layer 11b, thereby exposing opposite ends of strip 74, as shown. Via holes 76, 78 are formed in a conventional manner, here by placing a mask over such opposite ends of strip 74 during the formation of second oxide layer 11b. Referring to FIG. 6, it may be appreciated that the opposite ends of first level strip 74 exposed by via holes 76, 78 comprise the interconnection terminals I of crossunder C. As discussed, each interconnection terminal I on integrated circuit 10 comprises a region of first level metallization exposed by a via hole disposed in an overlaid upper oxide layer 11b.

First level metallization strip 74 provides an electrical short-circuit between via holes 76, 78 running beneath insulating oxide layer 11b. A crossunder C is used in the present invention when it becomes necessary, in the fabrication of a desired circuit on integrated circuit 10 by second level metallization, for second level metallization paths to intersect without making an electrical connection therebetween. For example, crossunder C in FIG. 7 may be used to allow second level metallization paths 80, 82 (shown in phantom) to cross without coming into contact with each other. Briefly, crossunder C couples second level path 80 through the first level in the region of intersection between paths 80, 82. Second level metallization path 80, running from left to right, is formed on oxide layer 11b in a conventional manner. Second level metallization path 80 is interrupted at the second level in the region of intersection with path 82 and terminates at end regions 80a, 80b, disposed over via holes 76, 78, respectively of crossunder C. That is, first level strip 74 is disposed in underlaying relationship with second level end regions 80a, 80b. During formation of second level path 80, metallized ends 80a, 80b each form within (i.e. fill) their respective via holes 76, 78, making electrical contact with first level metallization strip 74. Thus, an uninterrupted electrical path is formed along second level metallization path 80, a portion of which runs along first level metallization path 74 in the region of intersection between paths 80, 82. Second level metallization path 82 is formed on oxide layer 11b in a conventional manner and runs between via holes 74, 76 orthogonally to second level metallization path 80 and first level strip 74. The impedance between path 82 and strip 74 has been found to be approximately 50 Meg-ohms. Thus, intersection of second level paths 80, 82 is achieved by crossunder C while maintaining substantial electrical isolation therebetween. Further, with such arrangement, the resistance contributed by crossunder C to path 80 is approximately 60 milli-ohms. In prior art arrangements, where diffusions rather than via holes were used, much greater resistance, on the order of 10 to 150 ohms, was introduced.

As discussed, every interconnect terminal I on integrated circuit 10 comprises a region of first level metallization exposed by a via hole disposed through an overlaid insulating oxide layer. Thus, a second level metallization connection to such interconnect terminal (such as the connection made between second level path 41 and terminal $I_{14}$ in FIG. 2) is made by forming an end of the second level metallization path over the via hole comprising the interconnect terminal with the second level metallization forming inside such via hole and thereby making electrical contact with the underlaying first level metallization path (path 49 for interconnect terminal $I_{14}$).

Figure 8:
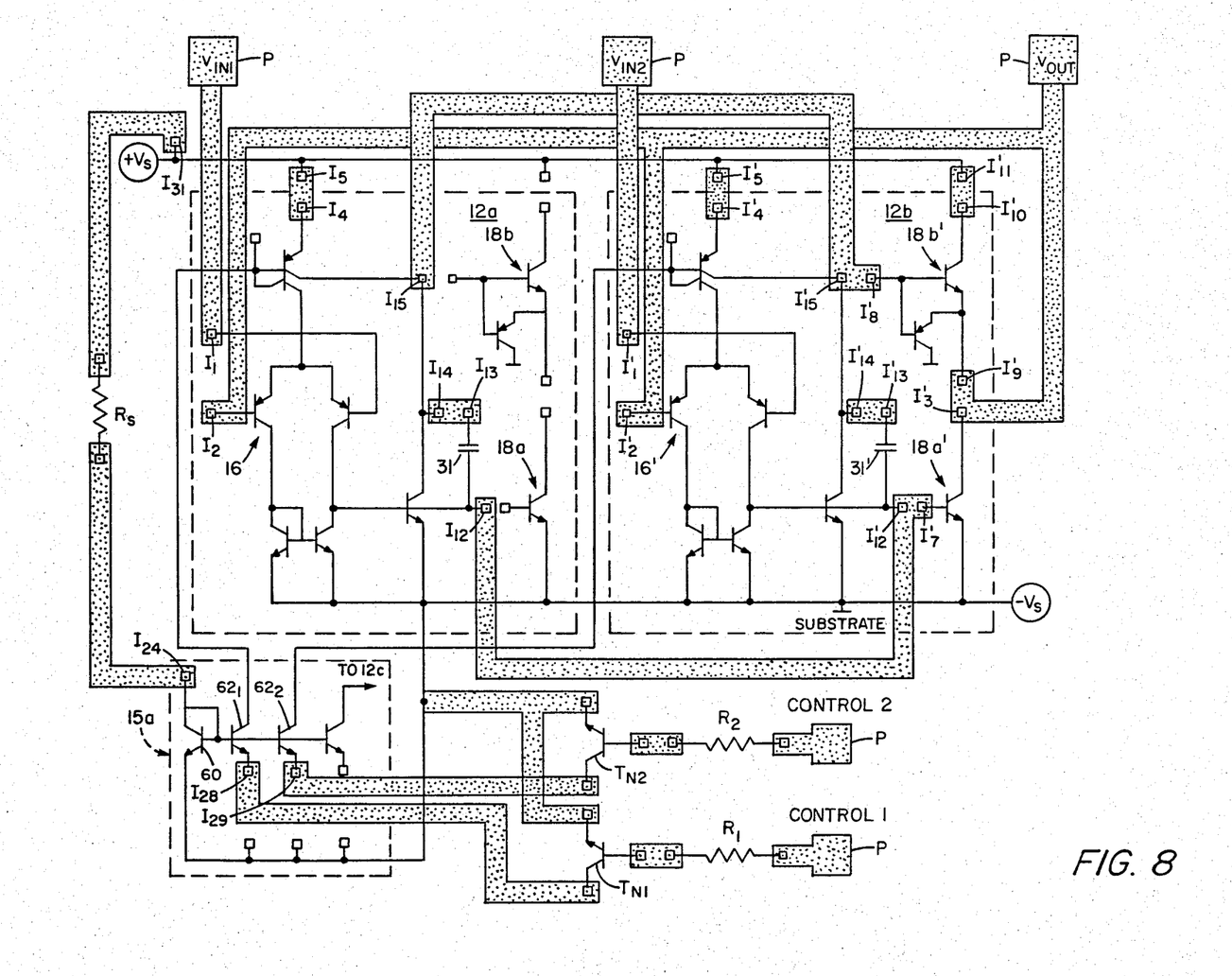
FIG. 8 is a schematic diagram of a circuit comprising a pair of the individual configurable analog integrated circuits of FIG. 2.

As discussed above, selected ones of gain cells 12a–12l may be interconnected in the present invention to configure a desired circuit by making selected second level metallization connections therebetween. For example, shown in FIG. 8 is a single-pole-double-throw (SPDT) analog switch comprising gain cells 12a, 12b, as well as several of the interspersed transistors and resistors on integrated circuit 10. The gain cells 12a, 12b, and electrical components are selectively interconnected as shown by second level metallization paths. A first one of the plurality of pads P is applied with the first voltage $V_{IN1}$ to be switched, such signal being applied to the positive input of gain cell 12a by a second level metallization path. The second signal to be switched, $V_{IN2}$, is applied to a second one of the pads P and coupled to the positive input of gain cell 12b. The switched output signal of the SPDT switch, $V_{out}$, is coupled as shown by second level metallization from the output stages 18a', 18b' of gain cell 12b to a third pad P. Such signal is also applied as the negative input to each gain cell 12a, 12b, thereby making such gain cells operate with unity gain. Second level connections are made as shown internally to each gain cell 12a, 12b and between gain cells 12a, 12b. It is noted that only the output stages 18a', 18b' of gain cell 12b are used in the SPDT switch. Thus, second level metallization connections are made as shown to couple the gain stages 16, 16' of gain cells 12a, 12b, respectively, to output stages 18a', 18b'.

Switching control for the configured SPDT switch is provided by a pair of control signals, CONTROL 1 and CONTROL 2, fed to fourth and fifth pads P. Such signals preferrably are complementary logic signals. Each control signal, CONTROL 1, CONTROL 2, is coupled by second level metallization through a thin film resistor $R_1$, $R_2$ (used for current limiting) to the base electrode of a corresponding one of the plurality of NPN transistors $T_{N1}$, $T_{N2}$ disposed on integrated circuit 10. The collector and emitter electrodes of such transistors are connected by second level metallization between the emitter electrodes of current control circuit 15a transistors $62_1$, $62_2$, respectively, and $-V_s$.

In operation, when one of the control signals CONTROL 1, CONTROL 2 is high (logic 1), the corresponding one of transistors $T_{N1}$, $T_{N2}$ switches ON, placing $-Vhd s$ at the emitter electrode of corresponding transistor $62_1$, $62_2$, turning such transistor ON and thereby allowing such transistor $62_1$, $62_2$ to supply bias current to the gain cell 12a, 12b coupled thereto. The transistor $T_{N1}$, $T_{N2}$, fed by a logic 0 control signal is OFF, placing a high impedance at the emitter electrode of the transistor $62_1$, $62_2$ coupled thereto, thereby preventing bias current from being applied to the gain cell coupled to such corresponding transistor $62_1$, $62_2$.

Thus, it is seen that application of a logic 1 CONTROL 1 signal activates gain cell 12a, which responds by coupling $V_{IN1}$ to the output stages 18a, 18b of gain cell 12b, such signal thereby appearing as $V_{out}$. Conversely, application of a logic 1 CONTROL 2 signal activates gain cell 12b, which reproduces $V_{IN2}$ as $V_{out}$.

Having described a preferred embodiment of the present invention, other embodiments may now become apparent to persons having ordinary skill in the art. Accordingly, it is understood that the scope of the present invention is limited only by the scope of the appended claims.

What is claimed is:

1. An integrated circuit comprising:
a plurality of active circuit elements disposed in a semiconductor body, said plurality of active circuit elements being electrically interconnected to provide a pre-configured gain stage and a plurality of different, pre-configured output stages, said gain stage and plurality of output stages being disposed on a first level of the semiconductor body; and
means, disposed on a second, different level of the semiconductor body, for electrically connecting the gain stage to a selected one, or ones, of the plurality of output stages.

2. An integrated circuit comprising:
(a) a plurality of electrically isolated gain cells arranged in a predetermined pattern on a semiconductor body, each gain cell comprising:
(i) a plurality of active circuit elements electrically interconnected to provide a preconfigured gain stage and a plurality of different, preconfigured output stages, said gain stage and plurality of output stages being disposed on a first level of the semiconductor body; and
(ii) means, disposed on a second different level of the semiconductor body, for electrically interconnecting the gain stage to a selected one, or ones, of the plurality of output stages;
(b) a plurality of electrically isolated active and passive electrical components having terminals disposed on the first level of the semiconductor body, the plurality of active and passive electrical components being interspersed with the plurality of gain cells; and
(c) means, disposed on the second, different level of the semiconductor body, for electrically interconnecting a selected one, or ones, of the passive and active electrical components with other ones of the passive and active electrical components and with a selected one, or ones, of the plurality of gain cells.

3. The integrated circuit of claim 2 wherein the plurality of passive components comprise a plurality of resistors.

4. The integrated circuit of claim 3 wherein a portion of the plurality of resistors are grouped into a resistor cell, the plurality of resistors grouped into the resistor cell having binarily weighted resistance values.

5. The integrated circuit of claim 4 wherein the plurality of resistors comprise thin film resistors.

6. The integrated circuit of claim 2 further comprising means for providing intersection of, and electrical isolation between, a first one of the second level interconnecting means and a second one of the second level interconnecting means, said intersection and electrical isolation providing means comprising means for coupling the first interconnecting means through the first level in the region of intersection between the first and second interconnecting means.

7. The integrated circuit of claim 6 wherein the first one of the second level interconnecting means has first and second, spaced apart end regions in the region of intersection, and wherein the coupling means comprises:
a strip of electrically conducting material disposed on the first level in underlaying relationship with the first and second end regions; and
means, having relatively low resistance, for coupling the first end region to a first end of the first level strip and for coupling the second end region to a second end of the first level strip.

8. The integrated circuit of claim 2 wherein the first level thereof comprises a first level of metallization disposed on the semiconductor body and the second level interconnecting means comprises a second level of metallization disposed on the semiconductor body.

9. The integrated circuit of claim 2 wherein the first level is overlaid with an electrically insulating layer, each of the terminals comprising a portion of the first level exposed by a via hole passing through the insulating layer.

10. An integrated circuit comprising a plurality of gain cells, each one of the plurality of gain cells comprising:
a differential amplifier comprising a pair of emitter-coupled transistors, the coupled emitters being connected to a current source, and the collectors of the emitter-coupled transistors being coupled to a pair of transistors configured as a current mirror, one of said collectors being the output of the differential amplifier, said emitter-coupled transistors, current source and current-mirror transistors being disposed on a first level of the integrated circuit;
a first output stage comprising a transistor disposed on the first level, said first output stage transistor being configured as a common emitter transistor;
a second output stage comprising a transistor disposed on the first level and having an electrically isolated emitter; and
means, disposed on a second, different level of the integrated circuit, for selectively coupling either:
(i) the output of the differential amplifier to the first output stage configuring the gain cell as a comparator, with the collector of the first output stage transistor providing an output terminal for the comparator; or
(ii) additionally, the output of the differential amplifier to the base of the second output stage transistor and the emitter of the second output stage transistor to the collector of the first output stage transistor providing an operational amplifier circuit configuration.

11. The integrated circuit of claim 10 further comprising:
an input cell comprising a preliminary gain stage disposed on the first level; and
means, disposed on the second level, for coupling the preliminary gain stage to the differential amplifier.

12. The integrated circuit of claim 11 wherein the preliminary gain stage comprises a pair of transistors, the coupling means coupling the emitters of the pair of transistors to the base electrodes of the emitter-coupled transistors of the differential amplifier.

13. The integrated circuit of claim 10 further comprising:
a plurality of electrically isolated resistors disposed on the first level; and
means, disposed on the second level, for selectively coupling one, or ones, of the plurality of resistors to a selected one, or ones, of the plurality of gain cells.

14. The integrated circuit of claim 10 further comprising means for controlling the current source, said current source controlling means comprising:
a current mirror having an output coupled to the current source on the first level; and
means, disposed on the second level, for coupling a control terminal of the current mirror to a reference potential producing an output current from the current mirror.

15. An integrated circuit comprising:
a plurality of gain cells, each gain cell comprising: a preconfigured gain stage disposed on a first level of the integrated circuit; and, a plurality of preconfigured output stages disposed on the first level;
means, disposed on a second, different level of the integrated circuit, for electrically connecting the gain stage of a gain cell to a selected one, or ones, of the plurality of output stages of the gain cell; and
wherein the second level connecting means comprises means for electrically interconnecting a first one of the plurality of gain cells with a second one of the plurality of gain cells.

16. A method of providing an integrated circuit comprising the steps of:
providing a plurality of active circuit elements interconnected in a first level of a semiconductor body to provide a preconfigured gain stage and a plurality of preconfigured output stages; and
electrically interconnecting the gain stage to a selected one, or ones, of the plurality of output stages at a second level of the semiconductor body.

* * * * *